United States Patent [19]

Schulz

[11] Patent Number: 4,916,386
[45] Date of Patent: Apr. 10, 1990

[54] MICROWAVE WATTAGE INDICATOR

[76] Inventor: James E. Schulz, 13579 Caramel Trail, Eden Prairie, Minn. 55346

[21] Appl. No.: 325,918

[22] Filed: Mar. 20, 1989

[51] Int. Cl.⁴ .................... G01R 21/00; G01R 21/02
[52] U.S. Cl. ........................................ 324/95; 324/92; 324/106; 374/31; 374/150; 374/162
[58] Field of Search .................... 324/92, 95, 106; 219/10.55 D, 10.55 E, 10.55 F; 374/162–164, 166, 31, 149, 150; 340/786

[56] References Cited

U.S. PATENT DOCUMENTS

| | | | |
|---|---|---|---|
| 2,866,950 | 12/1958 | Smits | 324/92 |
| 3,661,142 | 5/1972 | Flam | 128/736 |
| 4,030,482 | 6/1977 | Navato | 128/736 |
| 4,051,435 | 9/1977 | Fomslow | 324/95 |
| 4,382,063 | 5/1983 | Romito et al. | 374/162 |
| 4,464,064 | 8/1984 | D'Luzansky | 374/162 |
| 4,467,278 | 8/1984 | Foth et al. | 374/162 |
| 4,509,533 | 4/1985 | Chervity | 128/736 |
| 4,538,926 | 9/1985 | Chretien | 374/162 |
| 4,786,773 | 11/1988 | Keefer | 219/10.55 F |
| 4,835,475 | 5/1989 | Hanakura et al. | 340/786 |

FOREIGN PATENT DOCUMENTS

| | | | |
|---|---|---|---|
| 0141266 | 3/1949 | Australia | 374/162 |
| 2105850 | 7/1972 | Fed. Rep. of Germany | 374/162 |
| 2426249 | 1/1980 | France | 374/162 |
| 0147025 | 11/1981 | Japan | 374/149 |

*Primary Examiner*—Reinhard J. Eisenzopf
*Assistant Examiner*—W. Burns
*Attorney, Agent, or Firm*—William Nitkin

[57] ABSTRACT

A microwave oven wattage detector having a visually and microwave transparent container holding a thermally homogeneous fluid having a wattage-indicating strip contained in the fluid with a plurality of different temperature-sensitive areas on the strip with indicia associated with each of the areas to indicate power levels when such container is heated within a microwave oven for a set time and one of such temperature-sensitive areas changes color to denote the indicia indicating the power level of the microwave oven.

11 Claims, 2 Drawing Sheets

MICROWAVE WATTAGE INDICATOR

BACKGROUND OF THE INVENTION

1. Field of the invention

The present invention resides in the area of microwave wattage measurement devices and more particularly relates to a self-contained device that can be used to determine simply and quickly the power output of microwave ovens.

2. Description of the Prior Art

Microwave wattage measurement devices are known in the prior art and are generally utilized for industrial purposes. The present system of microwave power measurement is typified by U.S. Pat. No. 2,866,950 to Smits for Microwave Power Measurement Device. This device utilizes calorimetric measurements by noting the rise in temperature of a fluid flowing at a fixed rate through a microwave transmission where the rise in temperature is a function of the microwave power absorbed by the fluid. These devices generally require trained personnel to operate, are used solely in industry and are too complex and expensive for home use.

In determining the calorimetric measurement for microwave ovens, one is generally not able to place standard thermometers or other metallic temperature measurement devices within the microwave oven while it is operating.

Microwave ovens are commonly sold for home and restaurant use and are rated according to their wattage output which is generally between 400-1000 watts. The users of such ovens for cooking purposes do not have any direct knowledge of, or any means to confirm, whether their ovens are performing at the wattage level indicated by the manufacturer. Since many microwave ovens over a period of years of use could possibly lose power, home microwave oven owners have no simple means for determining whether their microwave ovens are still performing at their original designated power levels. This information is important as the power output level helps users to determine accurately the length of time to cook microwave food products. Such food products often are frozen, and cooking directions state specific cooking times for particular oven power output levels. If the particular oven does not match the manufacturer's indication of its power output level, then the food will not be cooked properly.

SUMMARY OF THE INVENTION

The object of this invention is to provide a microwave wattage indicator that is simple, inexpensive and convenient for untrained individuals to use and which will yield an accurate reading of the power level of the microwave oven when placed within its heating chamber. When the device of this invention is placed within the microwave oven in the field of microwave radiation, after a set period of time it will indicate the specific wattage or power level of the oven. Such device works, as will be described in further detail below, by providing a container of a thermally homogenous fluid and a visible liquid crystal strip with indicia associated therewith. The fluid within the container heats when exposed to microwave radiation and will rise in temperature causing a specific liquid crystal member of the strip to change color and thereby designate the amount of power produced within the microwave oven. The device makes use of the thermodynamic principle that a fluid of constant heat capacity, fixed mass and fixed starting temperature when exposed to a constant level of microwave radiation for a fixed time will always experience the same increase in temperature. There is a basic thermodynamic relationship existing which states that when a compound of constant heat capacity is exposed to a fixed positive amount of energy, it will exhibit an exact and repeatable change in temperature. The relationship can be stated as follows:

$$C_p(T_2 - T_1) = \text{energy/mass}$$

$C_p$ = heat capacity; units of joules/gram degrees F.
$T_1$ = temperature initial; units of degrees F.
$T_2$ = temperature final; units of degrees F.

If the compound to be exposed to the microwave energy is of a fixed mass and the energy added is done during a fixed time, then the equation can be expressed as follows:

$$C_p(T_2 - T_1)(M)(1/t) = \text{energy/time} = \text{power}$$

$C_p$ = heat capacity; units of joules/gram degrees F.
$T_1$ = temperature initial; units of degrees F.
$T_2$ = temperature final; units of degrees F.
$M$ = mass of compound being heated; units of grams
$t$ = time of energy exposure; units of seconds.

The device of this invention makes use of the above relationship to determine the output power of the microwave oven. In practice, within the container utilized in this invention, water can be the compound of fixed heat capacity.

The invention herein makes use of the thermodynamic principle of the second equation, above, in conjunction with a method of measuring temperature within the device while it is in the field of microwave radiation within the microwave oven. The device of this invention determines the temperature change by the use of a liquid crystal strip having a plurality of different temperature-sensitive areas or members, each member being sensitive to a different temperature. The technology of liquid crystal thermometry is well known. Such devices have a plurality of cholesteric esters or equivalent material which can be utilized inside a field of microwave radiation. Such liquid crystal strips are not harmed by their short exposure to microwave radiation in the operation of the device of this invention. These cholesteric esters are manufactured such that certain esters exhibit color changes, such as from black to green, at specific temperatures. For example, an ester could change color at 100 degrees F. or another could change color at 104 degrees F. It is well known to have strips containing a series of specific esters in ascending order of activity used as temperature indicators. Such strips have been utilized as thermometers in a way similar to the conventional mercury bulb thermometer to record temperature changes. The technology of liquid crystal temperature sensing devices is well known and is described in many patents including U.S. Pat. Nos. 4,509,533; 4,030,482; and 3,661,142. Other equivalent materials that change color at specific temperature levels could also be used. In the preferred embodiment of the device of this invention a specially labelled liquid crystal strip made of a plurality of different temperature-sensing esters would be submerged in water held in a microwave transparent container. Such container would first be brought to a constant starting temperature using a controlled heat sink. To accomplish this, one could place such container into a refrigerator until chilled. Then the unit would be removed and allowed to warm up until one of the members of the thermometer strip reached the predetermined starting temperature and changed color thereby designating the word "start" imprinted next to or disposed as a mask over the segment that changed color at such "start" temperature. Once at the constant start temperature, the device of this invention is then placed in the microwave oven and heated at its maximum power for a preset period of time. At the end of that period, the water will have experienced a temperature change directly proportional to the amount of energy absorbed. The temperature change will cause one of the different temperature-sensing segments of the liquid crystal strip to exhibit a color change. In one embodiment when such segment of changed color is viewed through the mask of the liquid crystal strip's overlay, as described below, the mask's indicia will then be visible and will display the wattage output of the microwave oven. Indicia can also be printed beside each temperature-sensing segment.

DESCRIPTION OF THE PREFERRED EMBODIMENT(S)

Figure 1:
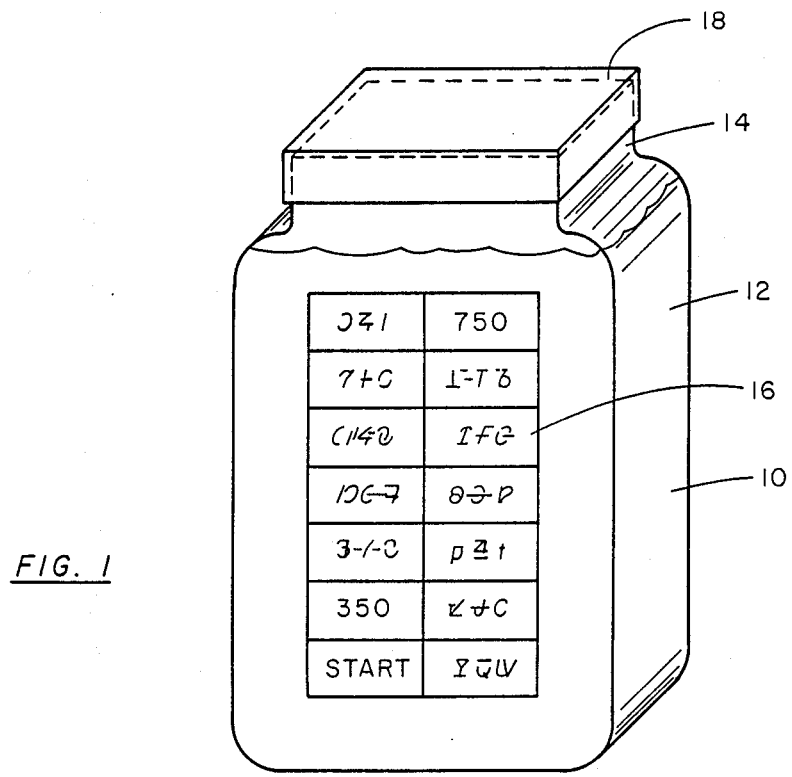
FIG. 1 illustrates a front view of the structure of the device of this invention.
Figure 2:
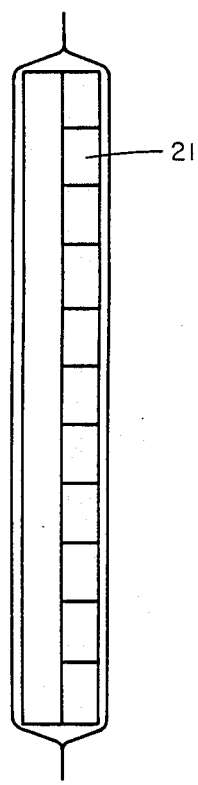
FIG. 2 illustrates a side view of the cholesteric ester strip which can be utilized in this invention.

FIG. 1 illustrates a perspective view of the device of this invention. Seen in this view is container 10 which should be of a visually and microwave transparent material of a dimension that will hold fluid 12 with little or no air entrapped at top 14. Container 10 must also be of a size that the liquid crystal strip 16 shown in enlarged detail in FIG. 3 can be fully submerged within fluid 12 or, in another embodiment, such strip can be attached to the outside of the flask in general contact over the boundaries of the fluid within container 10. Within container 10 is fluid 12 which should be of a thermally homogenous compound that has a constant heat capacity over the operating temperature range. One example of a preferred fluid is water. Water is non-reacting and safe. Even if it should spill onto food products, it will not poison the food in any way nor damage the microwave oven should the container leak. The container in FIG. 1 should have a snug-fitting cap 18 which is also pressure fit so that in the event of any overheating of fluid, the cap will pop off and release any pressure buildup. In one embodiment positioned over the liquid crystal strip is a wattage indicating mask overlay 20 as seen in FIG. 1 and, in more detail, in FIG. 3. Liquid crystal strip 20 is made up of a series of specifically chosen choleric esters arranged in ascending order of temperature activity. When such esters are not at their activating temperature, they are usually black. When they are at their specific activating temperature, they turn a color such as green. In one common type of overlay mask, the overlay matches the color of the unactivated strip segments such as black. The indicia is formed in the overlay as a clear portion so that the activated segment when it changes color will be visible through the clear portions of the mask overlay. Formed as a clear portion of the overlay are words and/or numbers 22 corresponding to wattage and/or power level and over such mask can be positioned a leak-proof laminate 24 to protect the ester material 21 and overlay from the heated fluid. In another embodiment the indicia designating temperature levels can be imprinted on a member with each indicia beside the corresponding segment of the liquid crystal strip.

Figure 3:
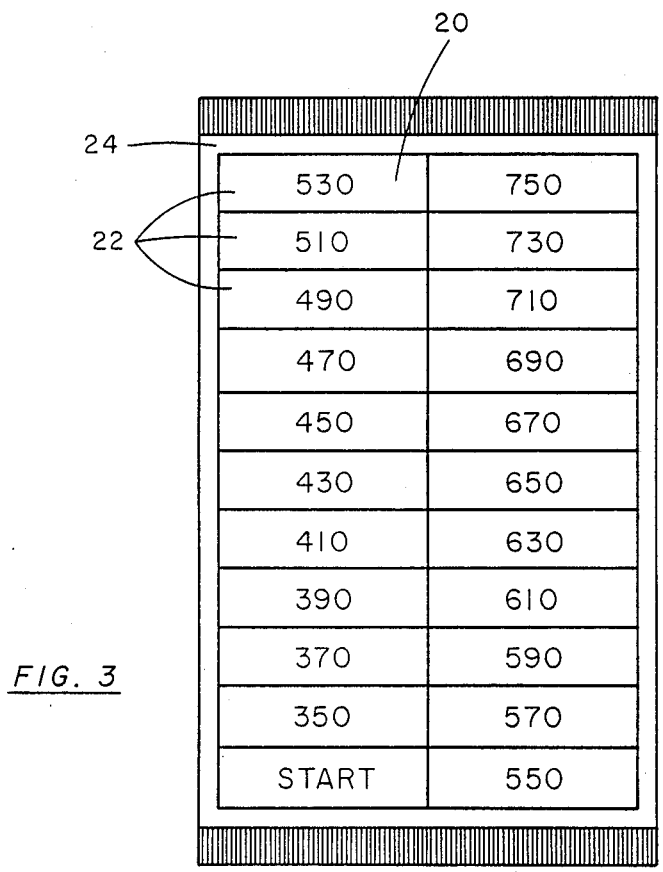
FIG. 3 illustrates a front view of a mask overlay which can be placed over the various members of temperature-sensitive material in the strip showing indicia indicating output wattage.

In one preferred embodiment of operation the water held within the container can be exactly 100 grams. The container can be of a clear, microwave transparent plastic material with little or no air gap between the top of the fluid and the pressure releasing cap. The wattage indication strip is provided inside the container and submerged in the fluid. In an alternate embodiment the wattage indication strip could be adhered to the exterior of the container but positioned over areas where the fluid is held within the container so as to sense the temperature of the fluid in the container. The container is exposed to a constant low temperature heat sink such as being placed inside a conventional refrigerator or in a water/ice bath for a sufficient period of time to bring the water in the container to a temperature below 50 degrees F. At this point the container would then be removed from the heat sink, such as the refrigerator, and allowed to warm up to 50 degrees F. at which time the first of the cholesteric ester segments will change to a visible green color indicating the word "start" as seen in FIG. 3. Such a procedure will allow $T_1$ in the equation below to remain constant at the chosen temperature of 50 degrees F. The container would then be placed in the center of the microwave oven. The microwave oven should be set on the maximum power setting and run for a fixed amount of time which in the example shown would be 30 seconds. The variables in the equation are now at fixed values except for $T_2$. The equation for a microwave oven rated at 500 watts maximum power output would be:

$$C_p(T_2-T_1)(M)(1/t) = \text{energy/time} = \text{power}$$

$$(2.33 \text{ joules/gram degrees F.})(T_2-50 \text{ degrees F.})(100 \text{ gms})(1/30 \text{ sec.}) = 500 \text{ joules/sec.} = 500 \text{ watts}$$

Therefore in the example above, the value of $T_2$ for a 500 watt oven will always be the same, that is, 114.4 degrees F. While this basic theory is operative, there are other minor variables such as heat loss due to vaporization and a 2-3 second delay on the microwave magnetron start up which tend to lower the actual temperature slightly, but these variables have been found to be constant so that by use of this formula very predictable temperature readings can be obtained. For the purpose of this example the liquid crystal strip can have a cholesteric ester that would change color at 114.4 degrees F. and the corresponding overlay over that section of the strip with proper clear areas forming the number 500 in the overlay would then make the number 500 visible in green meaning that 500 watts of power were absorbed so that by direct observation and without any calculation, the user would know the wattage of the microwave oven after 30 seconds by reading through the clear indicia of the mask overlay over that member of the strip that changes to a distinguishable color. The liquid crystal strips could be designed to have a series of cholesteric esters which cover temperature ranges of, for example, 95-150 degrees F. and thus be able to test and display wattages of 350–750 watts, the usual range of non-commercial microwave ovens. Some strips could have only three segments to display "High," "Medium," and "Low" power levels in the event manufacturers begin rating their microwave ovens with these power designations in the future. Of course, for other microwave ovens different fixed values for the formula and power output would be adopted. In practice one would choose the particular cholesteric esters corresponding to the maximum and minimum values of the temperature of the container once it has been heated.

Figure 4:
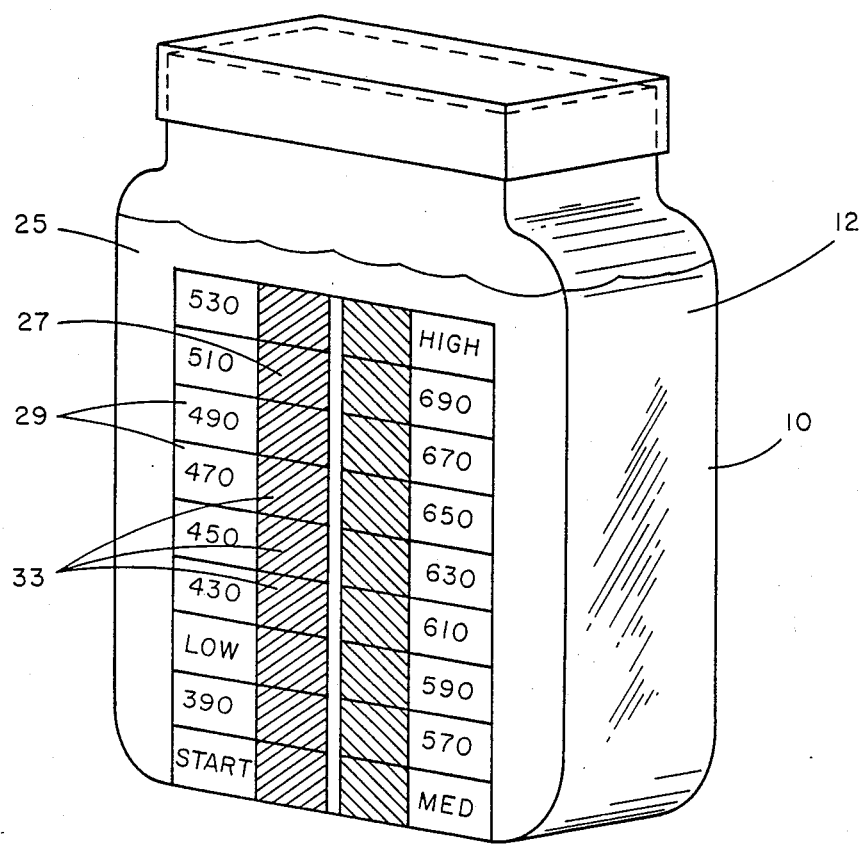
FIG. 4 illustrates a front perspective view of an embodiment where the temperature-sensing strip is positioned on the exterior of the container.

In an alternative embodiment shown in FIG. 4 container 10 has strip 27 adhered to front 25 of container 10 within the area of the front that is contacted on its interior by fluid 12. Temperature-sensing strip 27 is depicted to be of the type where indicia 29 are imprinted on planar member 31 adjacent to temperature-sensing members 33 of strip 27. This temperaturesensing member is read in the same way as the previous embodiment in that one observes which of the temperature-sensing members is of a different color and then reads the adjacent indicia, for example, low, medium or high, to determine the power level of the microwave oven.

By using the device of this invention a very inexpensive and simple method of determining microwave oven output wattage for untrained microwave oven owners is provided with a device having a specially designed liquid crystal strip for a direct readout of microwave wattage without the necessity for any calculations on the part of the user.

Although the present invention has been described with reference to particular embodiments, it will be apparent to those skilled in the art that variations and modifications can be substituted therefor without departing from the principles and spirit of the invention.

I claim:

1. A microwave oven wattage detector comprising:
   a microwave transparent container;
   a predetermined quantity M of thermally homogenous fluid at an initial temperature $T_1$ held within said container heated by said microwave oven for a fixed time t;
   a wattage indicating strip heated to a final temperature $T_2$ by said fluid, said strip including a plurality of temperature-sensitive members, each to be activated and change color at a different temperature, such strip having indicia associated with each member corresponding to power levels to determine, for a particular temperature $T_2$ when the formula:

$$C_p(T_2-T_1)(M)(1/t) = \text{energy/time} = \text{power}$$

where
   $C_p$ = heat capacity; units of joules/gram degrees F.
   $T_1$ = temperature initial; units of degrees F.
   $T_2$ = temperature final; units of degrees F.
   M = mass of compound being heated; units of grams
   t = time of energy exposure; units of seconds
   is utilized, the power level of said microwave oven.

2. The device of claim 1 wherein said wattage-indicating strip is positioned on the exterior of said container in an area corresponding to where fluid is held within said container adapted when the fluid is heated within said container, such heated fluid will heat said wattage-indicating strip through said container.

3. The device of claim 1 wherein said container is made of a visually transparent material.

4. The device of claim 3 wherein said wattage-indicating strip is positioned in the fluid in said container.

5. The device of claim 4 wherein said wattage-indicating strip comprises a plurality of liquid crystal members.

6. The device of claim 5 further including a mask overlay of the same color of the unactivated liquid crystal members, said mask having a plurality of clear areas forming indicia, said clear areas disposed over each of said liquid crystal members, said clear areas allowing the color change of an activated liquid crystal member to be visible therethrough thereby visually displaying the indicia of said mask overlay.

7. The device of claim 6 wherein said indicia on said mask overlay designates the power level of said microwave oven.

8. The structure of claim 7 wherein said container further includes a cap member adapted to be released from said container upon a pressure buildup in said container.

9. The device of claim 1 wherein the indicia associated with said temperature-sensitive members is positioned and printed adjacent to its related member.

10. The device of claim 6 wherein one of said indicia designates the initial temperature $T_1$ of said temperature-sensitive members by displaying the word "Start."

11. A method for determining wattage of a microwave oven comprising the steps of:
    providing a microwave-transparent container of a predetermined quantity M of thermally homogenous fluid;
    providing a plurality of temperature-sensitive members, each to change color al a plurality of different ascending temperatures;
    providing indicia indicating power levels associated with each of said temperature-sensitive members, said indicia associated with the temperature-sensitive member that changes color upon heating in said microwave oven corresponding to the $T_2$ in the formula:

$$C_p(T_2-T_1)(M)(1/t) = \text{energy/time} = \text{power}$$

where
    $C_p$ = heat capacity; units of joules/gram degrees F.
    $T_1$ = temperature initial; units of degrees F.
    $T_2$ = temperature final; units of degrees F.
    M = mass of compound being heated; units of grams
    t = time of energy exposure; units of seconds
    for determining the power level of a particular microwave oven;
    cooling said container to an initial temperature $T_1$;
    exposing said container to microwave radiation in said oven for a preset period of time t;
    determining by visual observation which of the temperature-sensitive members is visible; and
    associated indicia of said member which indicates the power level of said microwave oven.

* * * * *